(12) United States Patent
Ishida et al.

(10) Patent No.: US 6,842,066 B2
(45) Date of Patent: Jan. 11, 2005

(54) BIAS CIRCUIT AND SEMICONDUCTOR DEVICE

(75) Inventors: Shinji Ishida, Kanagawa (JP); Hironori Nagasawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/443,753

(22) Filed: May 23, 2003

(65) Prior Publication Data

US 2004/0046599 A1 Mar. 11, 2004

(30) Foreign Application Priority Data

May 24, 2002 (JP) ........................................ 2002-150505

(51) Int. Cl.[7] .............................................. G05F 1/10
(52) U.S. Cl. ................................................... 327/535
(58) Field of Search ................................ 327/143, 318, 327/319, 320, 333, 530, 534, 535, 537, 538, 543

(56) References Cited

U.S. PATENT DOCUMENTS

| | | | |
|---|---|---|---|
| 4,485,313 A | * 11/1984 | Nagano | 327/530 |
| 5,359,327 A | * 10/1994 | Brown et al. | 341/139 |
| 5,587,655 A | * 12/1996 | Oyabe et al. | 323/312 |
| 5,903,141 A | * 5/1999 | Tailliet | 323/312 |
| 6,392,469 B1 | * 5/2002 | Padoan et al. | 327/538 |

FOREIGN PATENT DOCUMENTS

| | | |
|---|---|---|
| JP | 5-276015 | 10/1993 |
| JP | 6-132734 | 5/1994 |
| JP | 2001-358543 | 12/2001 |

* cited by examiner

*Primary Examiner*—Jeffrey Zweizig
(74) *Attorney, Agent, or Firm*—Oblon, Spivak, McClelland, Maier & Neustadt, P.C.

(57) ABSTRACT

A bias circuit which supplies a bias voltage to a first transistor comprises a second transistor formed on a same semiconductor substrate as the first transistor and having a control electrode and a first and a second main electrodes; a resistance circuit; and a first and a second level shifters. The second transistor is either a metal semiconductor field effect transistor or a high electron mobility transistor. One end of the resistance circuit is connected to a voltage supply, other end of the resistance circuit is connected to the first main electrode of the second transistor, the control electrode of the second transistor is connected to the second main electrode of the second transistor, the second main electrode of the second transistor is connected to a common voltage. A voltage at the first main electrode of the second transistor is divided by the first and second level shifters and the divided voltage is outputted as the bias voltage.

19 Claims, 7 Drawing Sheets

BIAS CIRCUIT AND SEMICONDUCTOR DEVICE

CROSS-REFERENCE TO RELATED APPLICATIONS

This application is based upon and claims the benefit of priority from the prior Japanese Patent Application No. 2002-150505, filed on May 24, 2002; the entire contents of which are incorporated herein by reference.

BACKGROUND OF THE INVENTION

The present invention relates to a bias circuit and semiconductor device, and more particularly, this invention relates to a bias circuit which applies an optimal bias in response to a "variation" in thresholds of transistors in various kinds of semiconductor device, such as a high frequency power amplifier using MESFET (metal semiconductor field effect transistor) or HEMT (high electron mobility transistor), and a semiconductor device using the same.

A bias circuit which supplies a bias to a transistor has an important role in many cases in various kinds of semiconductor device, such as a high frequency amplifier, a mixer, a modulator and an oscillator which comprise transistors, such as MESFET and HEMT.

Hereafter, the high frequency amplifier which comprises MESFET will be mentioned as an example, and will be explained as an example of such a semiconductor device.

FIG. 7 is a schematic diagram showing the principal part of the high frequency amplifier which was attempted by the Inventors of the present invention in the course of attaining this invention. This amplifier is a power amplifier using MESFET (FET) which consists of gallium arsenide (GaAs), and for example, can be used as a front end amplifier for a cellular phone.

The amplifier illustrated in FIG. 7 has the amplification circuit PA and the bias circuit BC. The resistance R103 built in the bias circuit BC has a role to isolate a bias circuit from an amplification circuit at high-frequency.

This bias circuit BC consists of a voltage divider which includes resistances R101 and R102.

A voltage supplied to node n1 is divided at a constant ratio and is supplied to the input terminal n2 of an amplification circuit. In the amplification circuit PA, RF input is given to n3, and the drain power supply of FET is connected to n4. And RF output is obtained at n5.

However, in the case of the amplifier illustrated in FIG. 7, since the gate bias voltage outputted from the bias circuit BC is constant, when the threshold of FET of the amplification circuit PA varies, there is a problem that the drain current of the FET also varies according to the variation of the threshold.

In many cases, the consumption of the battery by a power amplifier may be a large part of a total consumption of the battery in mobile communications apparatus etc. Therefore, in order to lengthen the operation time of a battery, it is necessary to set a maximum limit in the drain current of a FET in a power amplifier.

However, since characteristic degradation including the decrease of gain and increase of distortion will arise if drain current is set low, it is also necessary to set a minimum limit in the drain current. Since drain current varies by a threshold in the case of the amplifier illustrated in FIG. 7, it is also necessary to set allowable maximum and minimum limits in the "variation range" of the threshold of FET.

However, since manufacturing process conditions vary for every wafer, "variation" arises also in a threshold in various kinds of transistors, such as GaAs MESFET. Besides, a "variation" in a threshold may also arises in a wafer, since process conditions may not be same throughout a wafer.

Such a "variation" in a threshold has become the cause of reducing a yield of production of power amplifiers.

The same situation is also seen in other application fields. That is, it is very important to suppress the "variation" in the operating characteristic resulting from the "variation" in the threshold to the minimum, in various kinds of semiconductor device using a transistor.

SUMMARY OF THE INVENTION

According to an embodiment of the invention, there is provided a bias circuit which supplies a bias voltage to a first transistor, comprising: a second transistor formed on a same semiconductor substrate as the first transistor and having a control electrode and a first and a second main electrodes; a resistance circuit; and a first and a second level shifters, the second transistor being either a metal semiconductor contact type field effect transistor or a high electron mobility transistor, one end of the resistance circuit being connected to a voltage supply, other end of the resistance circuit being connected to the first main electrode of the second transistor, the control electrode of the second transistor being connected to the second main electrode of the second transistor, the second main electrode of the second transistor being connected to a common voltage, a voltage at the first main electrode of the second transistor being divided by the first and second level shifters and the divided voltage being outputted as the bias voltage.

According to other embodiment of the invention, there is provided a bias circuit which supplies a bias voltage to a first transistor, comprising: a second transistor formed on a same semiconductor substrate as the first transistor and having a control electrode and a first and a second main electrodes; a resistance circuit; and a first and a second level shifters, the second transistor being either a metal semiconductor field effect transistor or a high electron mobility transistor, one end of the resistance circuit being connected to a voltage supply, other end of the resistance circuit being connected to the first main electrode of the second transistor, the control electrode of the second transistor being connected to the second main electrode of the second transistor, the second main electrode of the second transistor being connected to a common voltage, the first main electrode of the second transistor being connected to one end of the first level shifter, other end of the first level shifter being connected to one end of the second level shifter, an other end of the second level shifter being connected to the common voltage, and the bias voltage being outputted from a node between the first and second level shifters.

According to other embodiment of the invention, there is provided a semiconductor device comprising: a first circuit including a first transistor; and a bias circuit which supplies a bias voltage to the first transistor, including: a second transistor formed on a same semiconductor substrate as the first transistor and having a control electrode and a first and a second main electrodes; a resistance circuit; and a first and a second level shifters, the second transistor being either a metal semiconductor field effect transistor or a high electron mobility transistor, one end of the resistance circuit being connected to a voltage supply, other end of the resistance circuit being connected to the first main electrode of the second transistor, the control electrode of the second transistor being connected to the second main electrode of the second transistor, the second main electrode of the second transistor being connected to a common voltage, a voltage at the first main electrode of the second transistor being divided by the first and second level shifters and the divided voltage being outputted as the bias voltage.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Hereafter, some embodiment of the invention will be explained, referring to drawings.

Figure 1:
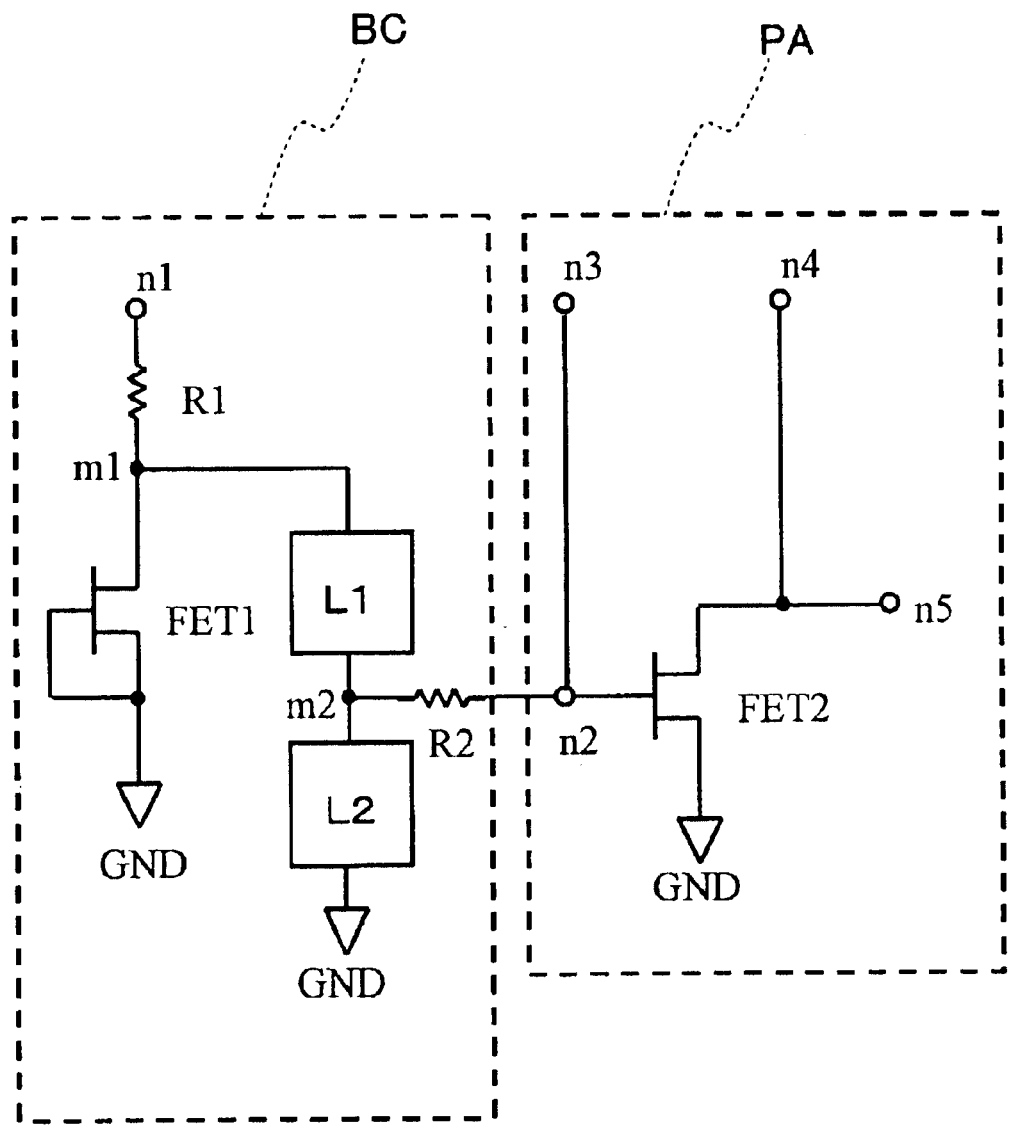
FIG. 1 is a schematic diagram illustrating the principal part of a bias circuit and a semiconductor device which comprises the bias circuit according to an embodiment of the present invention.
Figure 7:
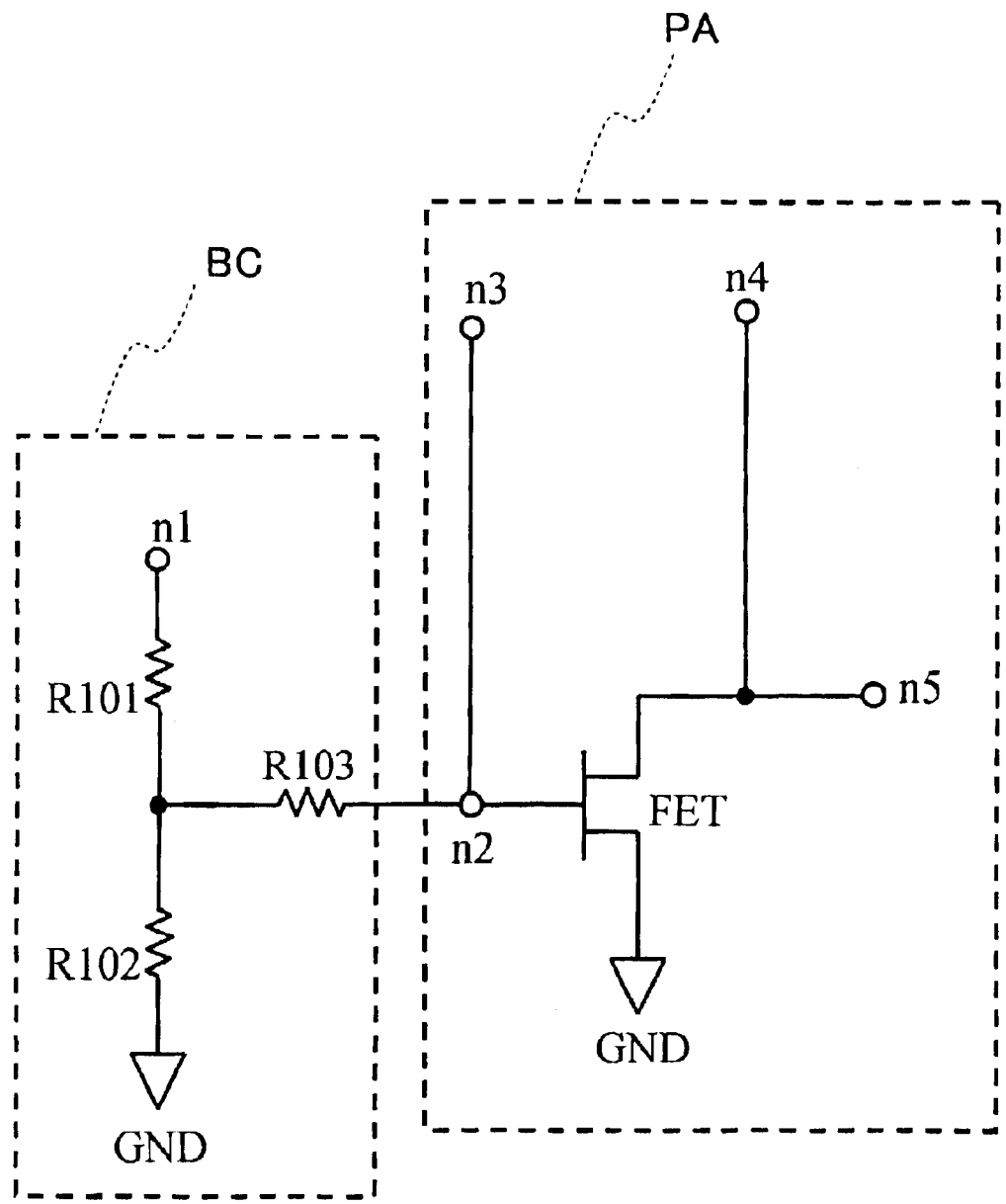
FIG. 7 is a schematic diagram showing the principal part of the high frequency amplifier which was attempted by the Inventors of the present invention in the course of attaining this invention.

FIG. 1 is a schematic diagram illustrating the principal part of a bias circuit and a semiconductor device which comprises the bias circuit according to an embodiment of the present invention. That is, the semiconductor device illustrated in FIG. 1 is a high frequency amplifier similar to what was illustrated in FIG. 7, and has the amplification circuit PA and the bias circuit BC. These circuits are formed on the same semiconductor substrate monolithically.

Resistance R2 has the role to isolate the bias circuit BC from the amplification circuit PA at high frequency. Since the amplifier PA is the same as what was illustrated in FIG. 7, same symbols are given to each element and detailed explanations are omitted.

The bias circuit BC of this embodiment has resistance R1, a transistor (FET1), and the first and second level shifters L1 and L2. The transistor (FET1) in the present invention is either a metal semiconductor contact type field effect transistor (MESFET) or a high electron mobility transistor (HEMT).

One terminal of resistance R1 is connected to a positive power supply at n1, and the other terminal is connected to the drain electrode of the transistor FET1.

The source electrode and the gate electrode of the transistor FET1 are connected. The source electrode of the transistor FET1 is grounded and the drain electrode is connected to one end of the first level shifter L1. That is, the transistor FET1 is connected so that FET1 operates in a saturation region when the voltage Vgs between the gate and the source is zero.

On the other hand, the other end of the first level shifter L1 is connected to one end of the second level shifter, and the other end of the second level shifter is grounded. Gate bias voltage is supplied to the amplification circuit PA through resistance R2 from the connection node m2 which connects the first level shifter L1 and the second level shifter L2.

The influence of the "variation" of the threshold of a transistor (FET2) can be compensated by forming the transistor (FET1) of the bias circuit BC and the transistor (FET2) of the amplification circuit PA monolithically in the structure explained above. That is, even if the threshold of the transistor (FET2) varies, the variation in the drain current can be suppressed. Hereafter, this mechanism will be explained.

First, the case where the threshold of the transistor (FET2) of the amplification circuit PA shifts to the negative side rather than the design value will be explained. In this case, the drain bias current of FET2 may increase, if the same bias is applied.

In contrast to this, the threshold of the transistor (FET1) of the bias circuit formed monolithically, i.e. formed on the same substrate with the same process as FET2, is also shifted to the negative side according to the embodiment. Then, since the drain current of FET1 increases, a potential drop occurs in resistance R1, and the potential of a node m1 falls.

Then, a potential of a node m2 also falls. Since no current flows through R2, the potential of the node n2 also falls through resistance R2 with response to the fall of potential of a node m2. Consequently, the gate bias voltage of FET2 falls.

That is, the gate bias voltage can be decreased in response to the threshold of FET2 having shifted to the negative side. Consequently, the increase in the drain bias current of FET2 resulting from "a gap" of a threshold can be suppressed.

On the other hand, when the threshold of the transistor FET 2 of the amplification circuit PA shifts to the positive side rather than a design value, a deviation of drain bias current can be similarly compensated. In this case, the threshold of the transistor FET 2 formed monolithically is also shifted to the positive side.

Since when the threshold of FET1 shifts to the positive side the drain current which flows through FET1 decreases, the potential becomes high in resistance R1. Consequently, the potential of node m1 rises.

In connection with it, the potential of the node m2 also rises. Since the potential of the node n2 rises through the resistance R2 in response to the potential rise of a node m2, the gate bias voltage of the transistor FET2 rises. Consequently, the fall of the drain bias current of FET2 can be suppressed.

It is possible to compensate the change in the drain bias current corresponding to the "deviation" of the threshold of FET2 so that it may be in a zero level by appropriately choosing the characteristic value of each element which constitutes the bias circuit BC in every cases mentioned above.

In the embodiment, the transistor (the transistor FET2 of the amplification circuit in the case shown in FIG. 1, for example) whose deviation of the threshold is to be compensated may desirably formed on a same substrate monolithically as the transistor FET2 of the bias circuit BC.

For example, if the transistors such as MESFETs or HEMTs are formed at the same time with the same process on the same wafer, the probability that "deviations" of their thresholds have the same tendency becomes very high. As a result, the "deviation" in FET2 can be compensated by the "deviation" which is similarly produced in FET1.

That is, the "variation" of characteristics between different wafers can be canceled according to the embodiment.

On the other hand, even if on the same wafer, distribution of the characteristics of semiconductor devices may arise by a non-uniformity of the gas flow or the temperature at the time of the process. However, the distribution of the characteristic on the same wafer is comparatively small in many cases.

If the transistor to be compensated for "deviation" of a threshold (the transistor FET 2 of the amplification circuit PA in the case shown in FIG. 1, for example) is formed closely to the transistor FET1 of the bias circuit BC so that they are included in a same semiconductor chip, the "deviation" of the thresholds of these transistors will be substantially the same in most cases.

That is, a "deviation" of a threshold can be compensated, without being influenced by distribution of the characteristic on the same wafer according to the embodiment.

Further, according to the embodiment, the transistor to be compensated for the "deviation" of a threshold, that is the transistor FET2 of the amplification circuit PA in the case shown in FIG. 1, for example, may have a same structure as the transistor FET1 of the bias circuit BC. In this case, since both of their thresholds and their "deviations" become almost the same, respectively, it is easy to design them.

However, it is not necessary that FET1 and FET2 have the exactly same structure, and they may have different structures. What is necessary is just to be able to predict the "deviation" of the characteristic of FET1 from the "deviation" of the characteristic of FET2. It is because the "deviation" of FET1 can be compensated by designing the bias circuit BC according to the relation therebetween if their relations are known. Therefore, the structure of the transistor FET2 of the bias circuit BC can be simplified, for example.

Hereafter, some of examples of the semiconductor device of the present invention will be introduced.

Figure 2:
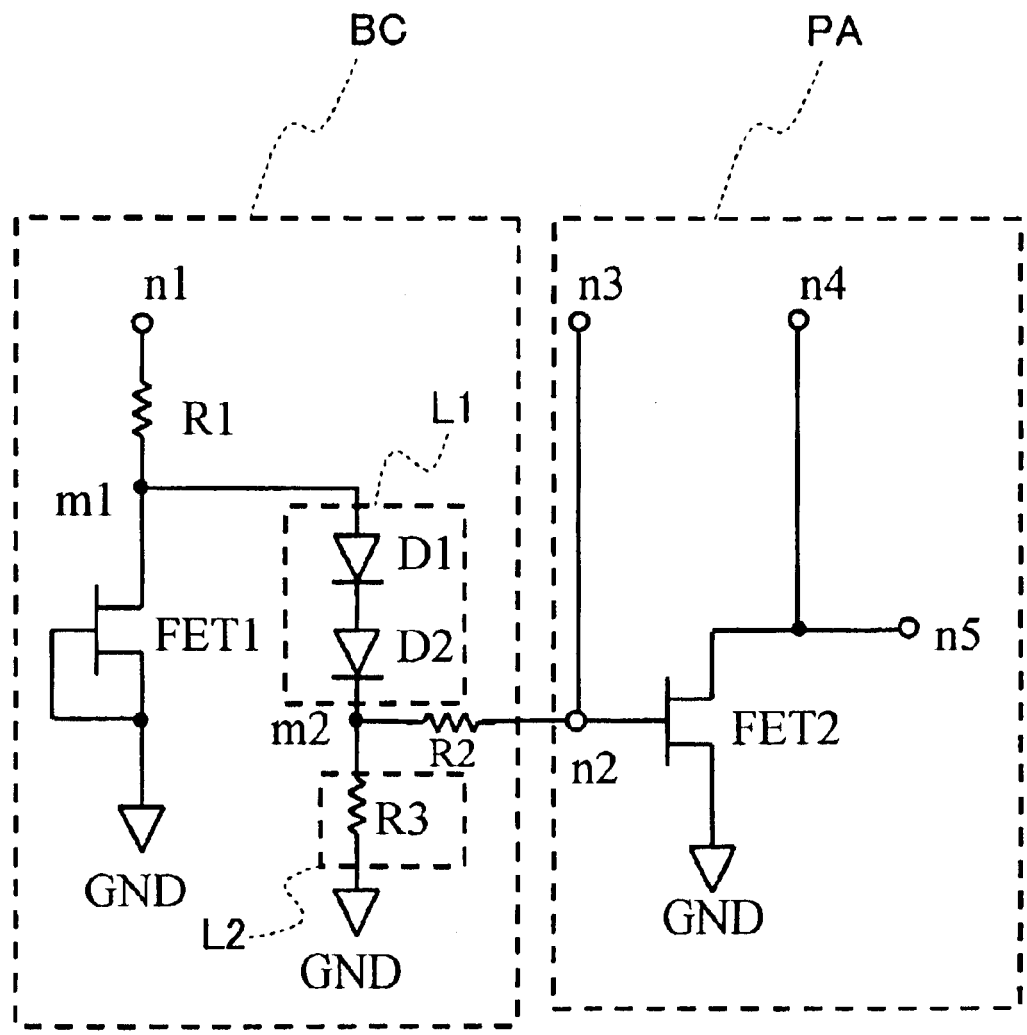
FIG. 2 is a schematic diagram illustrating the first example of the semiconductor device of the present invention.

FIG. 2 is a schematic diagram illustrating the first example of the semiconductor device of the present invention. The same symbols are given to the same elements as what was mentioned above with reference to FIG. 1 about this figure, and detailed explanation will be omitted.

This example is also an amplifier and has the amplification circuit PA and the bias circuit BC. The series connection circuit including diodes D1 and D2 is formed as first level shifter L1 of the bias circuit, and resistance R3 is formed as second level shifter L2.

For example, if the power supply voltage applied to n1 is 2V–3V and a potential of a node m1 is to be 1V–1.5V, a voltage drop of about 0.6V can be produced in a diode D1 or D2. The size and the number of these diodes should just be suitably determined according to the circuit constant needed.

In the case of the GaAs MESFET, it is advantageous to employ these diodes D1 and D2 because they can be formed with the same processes as FETs. Furthermore, these diodes D1 and D2 also have the advantage that the element size is compact and the high-frequency characteristic is also good.

Figure 3:
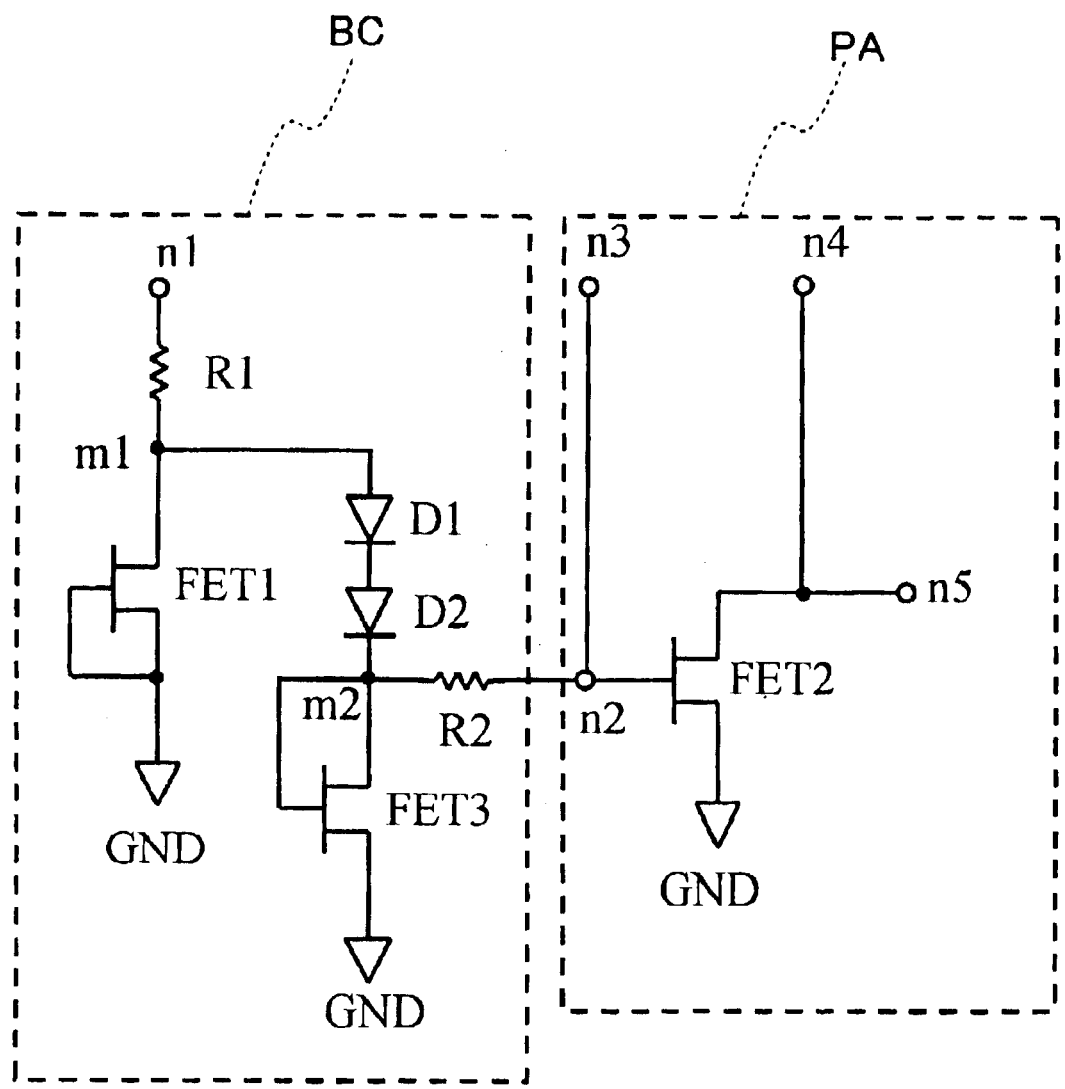
FIG. 3 is a schematic diagram showing the second example of the semiconductor device of the present invention.

FIG. 3 is a schematic diagram showing the second example of the semiconductor device of the present invention. The same symbols are given to the same elements as what was mentioned above about FIG. 1 or 2 also about this figure, and detailed explanation will be omitted.

This example is also an amplifier and has the amplification circuit PA and the bias circuit BC. The transistor FET 3 is provided as second level shifter L2 of the bias circuit BC. The same shift as the resistance R3 in FIG. 2 can be carried out by connecting the gate of this transistor FET 3 to the node m2.

Since the transistor FET 3 can be formed with the same process as other transistors (FET1, FET2), it is easy to manufacture them. Furthermore, it is also advantageous that the element size is compact, as compared with a resistive element.

Figure 4:
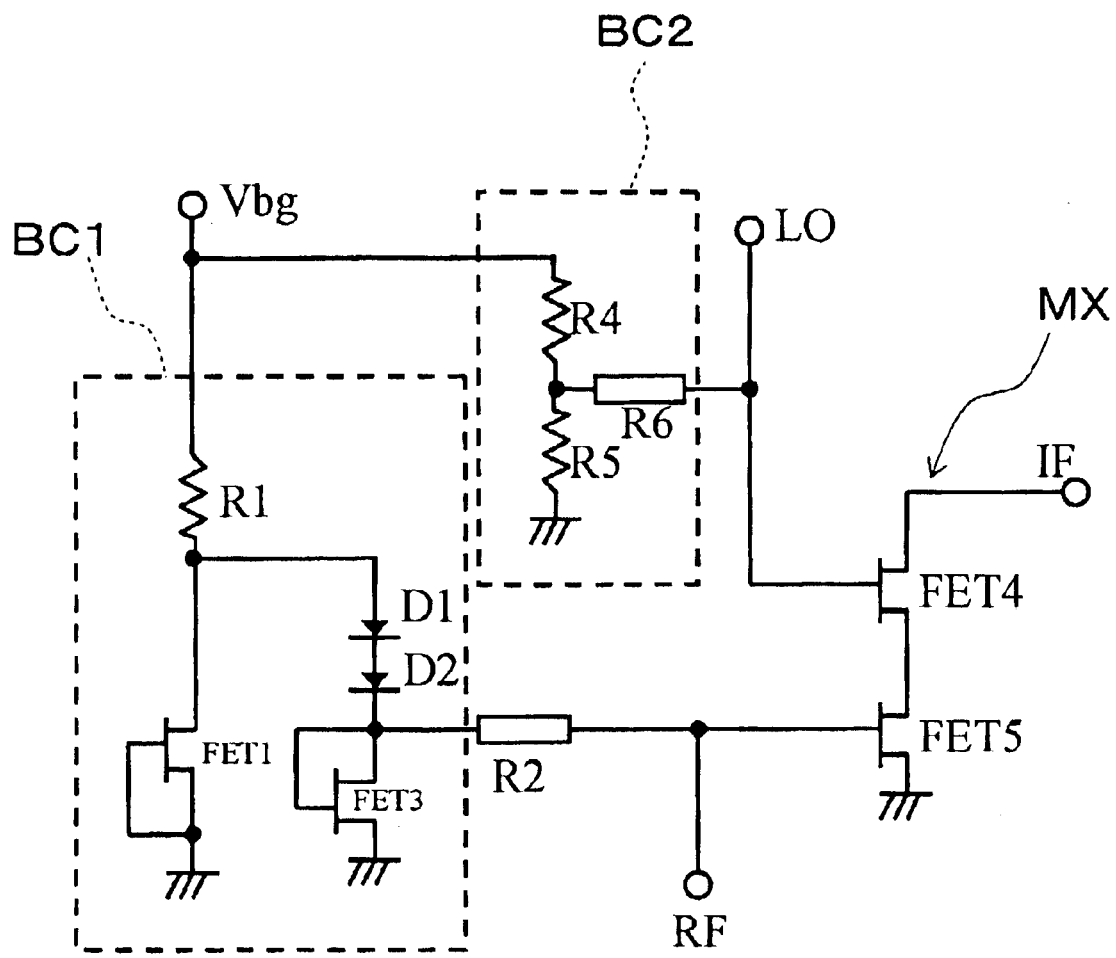
FIG. 4 is a schematic diagram showing the third example of the semiconductor device of the present invention.

FIG. 4 is a schematic diagram showing the third example of the semiconductor device of the present invention. The same symbols are given to the same elements as what was mentioned above about FIG. 1 or 3 about this figure, and detailed explanation will be omitted.

This example is the so-called single ended mixer. The mixer circuit MX has the arm which has a series connection of the transistors FET4 and FET5. The local oscillation signal LO is inputted into the gate of the transistor FET4, and RF signal is inputted into the gate of the FET5. RF signal is modulated by the local oscillation signal LO, and the intermediate frequency signal IF is outputted.

And in this example, the circuit same as a bias circuit BC1 for the transistor FET5 shown in FIG. 3 is provided. The "deviation" of the drain current produced by a "deviation" of the threshold of a transistor FET 5 can be compensated by providing such a bias circuit BC1.

In this example, another bias circuit BC2 has a structure where power supply voltage Vbg is divided by the resistances R4 and R5, and supplies bias to FET4 through the resistance R6, where R6 isolate R4 and R5 from the mixer at high frequency.

Figure 5:
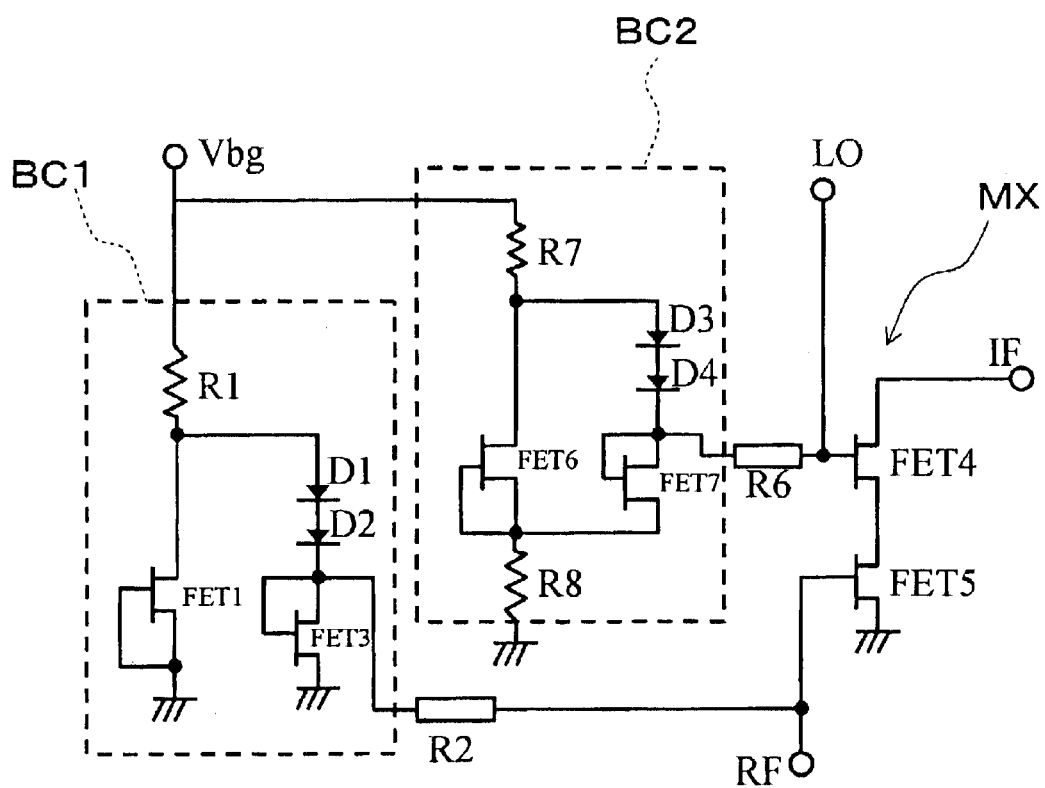
FIG. 5 is a schematic diagram showing the fourth example of the semiconductor device of the present invention.

FIG. 5 is a schematic diagram showing the fourth example of the semiconductor device of the present invention. The same symbols are given to the same elements as what were mentioned above about FIGS. 1 through 4 about this figure, and detailed explanation will be omitted.

This example is also the so-called single ended mixer. The mixer circuit MX has the same structure as what was illustrated in FIG. 4. The bias circuit BC2 is made to have the same structure as the circuit illustrated in FIG. 3. Then, the "deviation" of drain current can be compensated by the "deviation" of the threshold of the input transistor FET 4 of the local oscillation signal LO.

Figure 6:
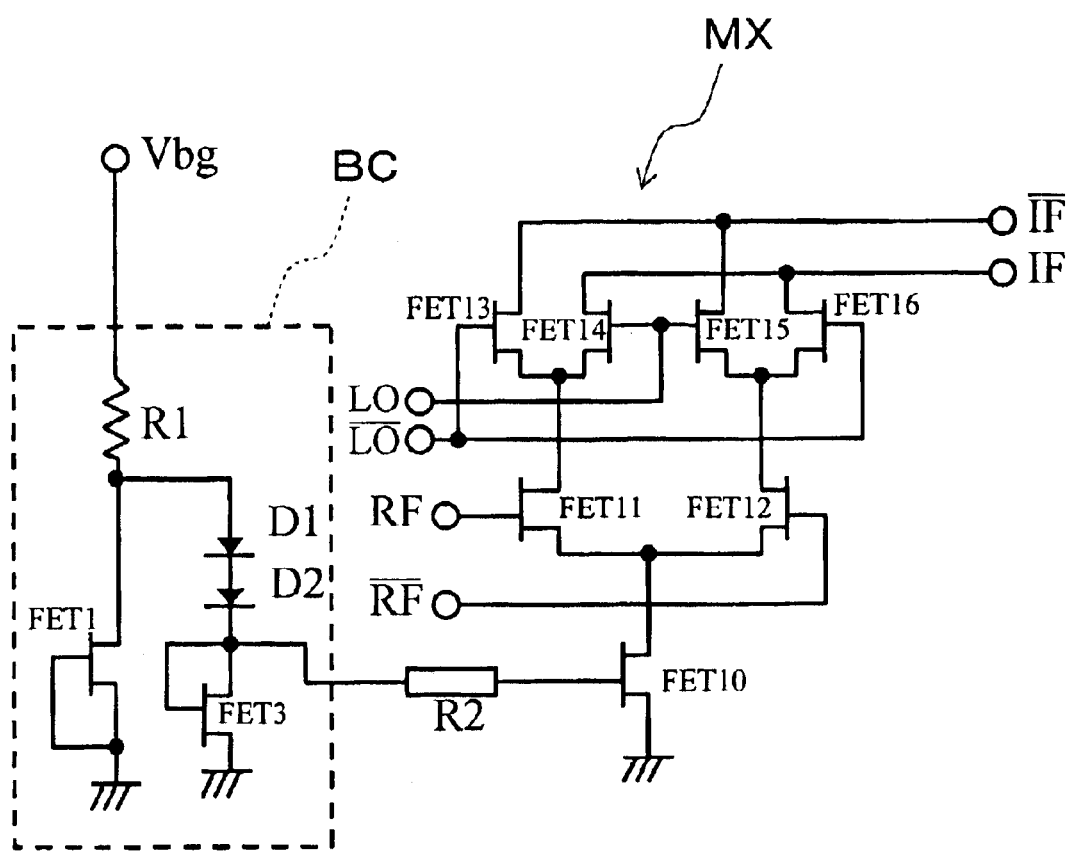
FIG. 6 is a schematic diagram showing the fifth example of the semiconductor device of the present invention.

FIG. 6 is a schematic diagram showing the fifth example of the semiconductor device of the present invention. The same symbols are given to the same elements as what were mentioned above about FIGS. 1 through 5 about this figure, and detailed explanation will be omitted.

This example is the so-called double balanced mixer. The mixer circuit MX has a pair of transistors FET11 and 12 connected in parallel to drain of the transistor FET 10, and two pairs of transistors 13, 14 and 15, 16 which are connected in parallel to transistors drain of FET 11 and 12 respectively.

RF signal, the local oscillation signal LO, the intermediate frequency signal IF, and these inversion signals are symmetrically provided so that isolation may be kept with each other. That is, the RF signal and the /RF signal are inputted into the gate of the transistors FET11 and FET12, the local oscillation signal LO is inputted into the gate of FET14 and FET15, a local oscillation signal /LO is inputted into the gate of FET13 and FET16, and the intermediate frequency signal IF and /IF are outputted from FET14, and FET16, FET13 and FET15, respectively.

In this example, the "deviation" of the drain current resulting from the "deviation" of a threshold is compensated by using what is illustrated in FIG. 3 as a bias circuit BC for the transistor FET10.

Change of the output produced by the "deviations" of the thresholds of FET 11 and FET 12 to which RF signals are inputted, and FETs 13–16 to which the local oscillation signals LO are inputted can also be compensated by using the bias circuits like what was mentioned above with reference to FIGS. 1 through 3.

Heretofore, the embodiments of the present invention have been explained, referring to the examples. However, the present invention is not limited to these specific examples. For example, about the concrete structures, such as resistances, transistors and level shifters, which the bias circuit of this invention includes, maybe appropriately selected by those skilled in the art with the known techniques to carry out the invention as taught in the specification and obtain equivalent effects.

Moreover, the semiconductor device of the present invention is not limited to the amplifier or mixer which is explained as examples, but all of the semiconductor device such as oscillators and modulators where the characteristic can be adjusted by adjusting the bias to a transistor are also included within the range of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A bias circuit which supplies a bias voltage to a first transistor, comprising:
   a second transistor formed on a same semiconductor substrate as the first transistor and having a control electrode and a first and a second main electrodes;
   a first constant resistance; and
   a first and a second level shifters,
   the second transistor being either a metal semiconductor field effect transistor or a high electron mobility transistor,
   one end of the first constant resistance being connected to a first voltage supply, other end of the first constant resistance being connected to the first main electrode of the second transistor, the control electrode of the second transistor being connected to the second main electrode of the second transistor, the second main electrode of the second transistor being connected to a second voltage supply lower than the first voltage supply,
   a voltage at the first main electrode of the second transistor being divided by the first and second level shifters and the divided voltage being outputted as the bias voltage.

2. The bias circuit according to claim 1, wherein the first level shifter has a diode.

3. The bias circuit according to claim 1, wherein the second level shifter has a second resistance.

4. The bias circuit according to claim 1, wherein the second level shifter has a third transistor having a control electrode and a first and a second main electrodes, the control electrode of the third transistor being connected to one of the first and second main electrodes of the third transistor.

5. The bias circuit according to claim 1, wherein the first transistor and the second transistor have a substantially same structure.

6. A bias circuit which supplies a bias voltage to a first transistor, comprising:
   a second transistor formed on a same semiconductor substrate as the first transistor and having a control electrode and a first and a second main electrodes;
   a first constant resistance; and
   a first and a second level shifters,
   the second transistor being either a metal semiconductor field effect transistor or a high electron mobility transistor,
   one end of the first constant resistance being connected to a first voltage supply, other end of the first constant resistance being connected to the first main electrode of the second transistor, the control electrode of the second transistor being connected to the second main electrode of the second transistor, the second main electrode of the second transistor being connected to a second voltage supply lower than the first voltage supply,
   the first main electrode of the second transistor being connected to one end of the first level shifter, other end of the first level shifter being connected to one end of the second level shifter, other end of the second level shifter being connected to the second voltage supply, and
   the bias voltage being outputted from a node between the first and second level shifters.

7. The bias circuit according to claim 6, wherein the first level shifter has a diode.

8. The bias circuit according to claim 6, wherein the second level shifter has a second resistance.

9. The bias circuit according to claim 6, wherein the second level shifter has a third transistor having a control electrode and a first and a second main electrodes, the control electrode of the third transistor being connected to one of the first and second main electrodes of the third transistor.

10. The bias circuit according to claim 6, wherein the first transistor and the second transistor have a substantially same structure.

11. A semiconductor device comprising:
    a first circuit including a first transistor; and
    a bias circuit which supplies a bias voltage to the first transistor, including:
        a second transistor formed on a same semiconductor substrate as the first transistor and having a control electrode and a first and a second main electrodes;
        a first constant resistance; and
        a first and a second level shifters,
        the second transistor being either a metal semiconductor field effect transistor or a high electron mobility transistor,
        one end of the first constant resistance being connected to a first voltage supply, other end of the first constant resistance being connected to the first main electrode of the second transistor, the control electrode of the second transistor being connected to the second main electrode of the second transistor, the second main electrode of the second transistor being connected to a second voltage supply lower than the first voltage supply, a voltage at the first main electrode of the second transistor being divided by the first and second level shifters and the divided voltage being outputted as the bias voltage.

12. The semiconductor device according to claim 11, wherein the first main electrode of the second transistor is connected to one end of the first level shifter, other end of the first level shifter is connected to one end of the second level shifter, other end of the second level shifter is connected to the second voltage supply, and the bias voltage is outputted from a node between the first and second level shifters.

13. The semiconductor device according to claim 11, wherein the first level shifter has a diode.

14. The semiconductor device according to claim 11, wherein the second level shifter has a second resistance.

15. The semiconductor device according to claim 11, wherein the second level shifter has a third transistor having a control electrode and a first and a second main electrodes, the control electrode of the third transistor being connected to one of the first and second main electrodes of the third transistor.

16. The semiconductor device according to claim 11, wherein the first transistor and the second transistor have a substantially same structure.

17. The semiconductor device according to claim 11, wherein the first circuit is an amplification circuit.

18. The semiconductor device according to claim 11, wherein the first circuit is a single ended mixer.

19. The semiconductor device according to claim 11, wherein the first circuit is a double balanced mixer.

* * * * *